(12) United States Patent
Li et al.

(10) Patent No.: US 9,960,226 B2
(45) Date of Patent: May 1, 2018

(54) HIGH DENSITY CAPACITOR STRUCTURE AND METHOD

(71) Applicant: GLOBALFOUNDRIES INC., Grand Cayman (KY)

(72) Inventors: Wai-Kin Li, Beacon, NY (US); Chengwen Pei, Danbury, CT (US); Ping-Chuan Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/661,504

(22) Filed: Jul. 27, 2017

(65) Prior Publication Data

US 2017/0323937 A1    Nov. 9, 2017

Related U.S. Application Data

(62) Division of application No. 14/692,881, filed on Apr. 22, 2015, now Pat. No. 9,755,013.

(51) Int. Cl.
*H01L 49/02* (2006.01)
*H01L 21/8238* (2006.01)
*H01L 27/06* (2006.01)

(52) U.S. Cl.
CPC ...... *H01L 28/92* (2013.01); *H01L 21/823821* (2013.01); *H01L 21/823842* (2013.01); *H01L 21/823857* (2013.01); *H01L 27/0629* (2013.01)

(58) Field of Classification Search
CPC combination set(s) only.
See application file for complete search history.

(56) References Cited

U.S. PATENT DOCUMENTS

| | | | |
|---|---|---|---|
| 7,608,877 B2 | 10/2009 | Shioya et al. | |
| 7,659,164 B1 | 2/2010 | Yoo | |
| 7,811,883 B2 | 10/2010 | Cohen | |
| 8,729,665 B2 | 5/2014 | Klootwijk et al. | |
| 8,796,119 B2 | 8/2014 | Samuelson et al. | |
| 2005/0266652 A1 | 12/2005 | Chudzik et al. | |
| 2008/0068876 A1* | 3/2008 | Sandhu | B82Y 10/00 365/149 |
| 2010/0012921 A1 | 1/2010 | Kawashima et al. | |
| 2011/0244302 A1 | 10/2011 | Wasson | |
| 2012/0127630 A1 | 5/2012 | Lin et al. | |

(Continued)

FOREIGN PATENT DOCUMENTS

WO    2014/081982 A1    5/2014

OTHER PUBLICATIONS

Taiwanese Official Action dated Jun. 23, 2017 received in related application TW 105109667 together with an English language translation.

*Primary Examiner* — Ratisha Mehta
(74) *Attorney, Agent, or Firm* — Scully Scott Murphy and Presser (57) ABSTRACT

High density capacitor structures based on an array of semiconductor nanorods are provided. The high density capacitor structure can be a plurality of capacitors in which each of the semiconductor nanorods serves as a bottom electrode for one of the plurality of capacitors, or a large-area metal-insulator-metal (MIM) capacitor in which the semiconductor nanorods serve as a support structure for a bottom electrode of the MIM capacitor subsequently formed.

19 Claims, 5 Drawing Sheets

(56) References Cited

U.S. PATENT DOCUMENTS

| | | |
|---|---|---|
| 2012/0322164 A1 | 12/2012 | Lal et al. |
| 2013/0316512 A1 | 11/2013 | Gunawan et al. |
| 2013/0328116 A1 | 12/2013 | Chang et al. |
| 2014/0138786 A1 | 5/2014 | Peterson et al. |
| 2014/0145299 A1 | 5/2014 | Kalnitsky et al. |
| 2014/0209854 A1 | 7/2014 | Bangsaruntip et al. |
| 2014/0225184 A1* | 8/2014 | Colinge ............. H01L 29/7827 257/329 |

* cited by examiner

HIGH DENSITY CAPACITOR STRUCTURE AND METHOD

RELATED APPLICATION

This application is a divisional of U.S. Ser. No. 14/692,881, filed Apr. 22, 2015, the entire contents of which are incorporated herein by reference.

BACKGROUND

The present application relates to capacitor fabrication, and more particularly, to the formation of high density capacitors using nanostructures.

Capacitors are important components in memory, logic and analog circuits. Due to the limitation of capacitance per unit area, capacitors always occupy a considerable chip area in a whole circuit layout. As integrated circuitry density has increased, the available die area for capacitors is decreasing. The decreased capacitor area in a denser circuit makes it more difficult to include capacitors having sufficiently high capacitance. Therefore, there remains a need for structures and methods that can increase capacitance for a fixed capacitor area on a chip.

SUMMARY

The present application provides high density capacitor structures based on an array of semiconductor nanorods. The high density capacitor structure can be a plurality of capacitors in which each of the semiconductor nanorods serves as a bottom electrode for one of the plurality of capacitors, or a large-area metal-insulator-metal (MIM) capacitor in which the semiconductor nanorods serve as a support structure for a bottom electrode of the MIM capacitor subsequently formed.

In one aspect of the present application, a method of forming a plurality of capacitors is provided. The method includes first forming a plurality of semiconductor nanorods on a semiconductor substrate. The plurality of semiconductor nanorods is oriented perpendicular to a top surface of the semiconductor structure. After conformally depositing a dielectric material layer over the exposed surfaces of the semiconductor substrate and the plurality of semiconductor nanorods, a conductive material layer is formed over the dielectric material layer. The conductive material layer fills spaces between the plurality of semiconductor nanorods.

In another aspect of the present application, a semiconductor structure including a plurality of capacitors is provided. The plurality of capacitors includes a plurality of semiconductor nanorods present on and oriented perpendicularly to a top surface of a semiconductor substrate, a conformal dielectric material layer present on exposed portions of the top surface of the semiconductor substrate and around sidewalls of the plurality of semiconductor nanorods, and a conductive material layer located on the conformal dielectric material layer. The conductive material layer laterally surrounds the plurality of semiconductor nanorods.

In another aspect of the present application, a semiconductor structure including a capacitor is provided. The capacitor includes a plurality of semiconductor nanorods present on and oriented perpendicular to a top surface of a semiconductor substrate. A top surface of each of the plurality of semiconductor nanorods has a catalyst dot present thereon. The capacitor further includes a conformal first conductive material layer present on exposed surfaces of the top surface of the semiconductor substrate, the plurality of semiconductor nanorods, and the catalyst dots, a conformal dielectric material layer present on the conformal first conductive material layer, and a second conductive material layer present on the dielectric material layer. The second conductive material layer fills the spaces between the plurality of semiconductor nanorods and has a top surface above a topmost surface of the conformal dielectric material layer.

In yet another aspect of the present application, a method of forming a capacitor is provided. The method includes first forming a plurality of semiconductor nanorods on a semiconductor substrate. The plurality of semiconductor nanorods is oriented perpendicular to a top surface of the semiconductor structure. A top surface of each of the plurality of semiconductor nanorods has a catalyst dot present thereon. After conformally depositing a first conductive material layer over the exposed surfaces of the semiconductor substrate, the plurality of semiconductor nanorods, and the catalyst dots, a dielectric material layer is conformally deposited over the first conductive material layer. Next, a second conductive material layer is formed over the dielectric material layer. The second conductive material layer fills spaces between the plurality of semiconductor nanorods.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
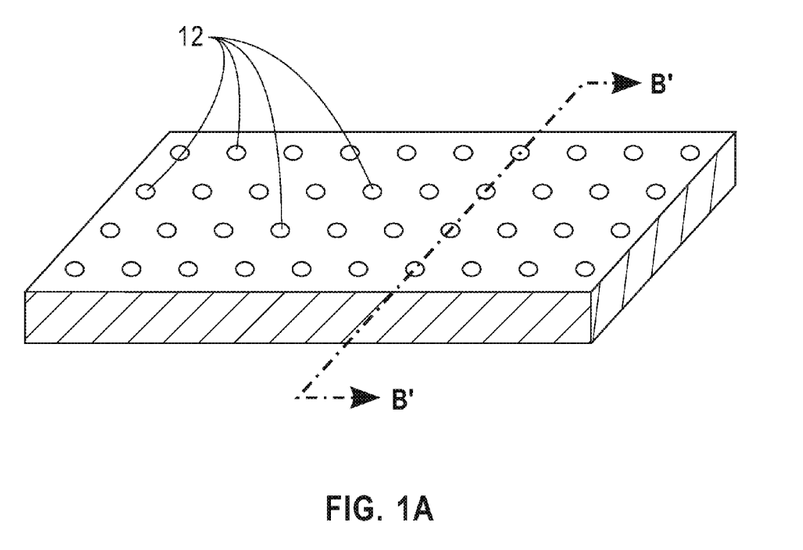
FIG. 1A is a perspective view of a first exemplary semiconductor structure including a semiconductor substrate on which a plurality of catalyst dots are formed according to a first embodiment of the present application.
Figure 1B:
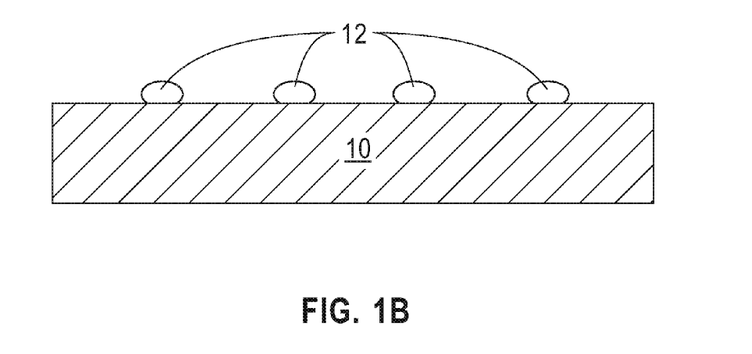
FIG. 1B is a cross-sectional view of the first exemplary semiconductor structure of FIG. 1A along line B-B'.

Referring to FIGS. 1A and 1B, a first exemplary semiconductor structure according to a first embodiment of the present application includes a plurality of catalyst dots 12 formed on a semiconductor substrate 10. The semiconductor substrate 10 may be composed of any suitable semiconductor material, such as, for example, Si, Ge, SiGe, SiC, SiGeC, and III/V compound semiconductors including InAs, GaAs, and InP. In one embodiment, the semiconductor substrate 10 is comprised of Si. The semiconductor substrate 10 is typically chosen to have a (111) crystal orientation so that the nanorod growth will occur perpendicular to the substrate surface. The thickness of the semiconductor substrate 10 can be from 400 μm to 1,000 μm, with a thickness from 50 μm to 900 μm being more typical.

The catalyst dots 12 are employed to facilitate the growth of semiconductor nanorods and may include a metal such as, for example, gold, aluminum, titanium, indium, iron, or nickel. The catalyst dots 12 may be distributed in a regular pattern with desired spacing between the catalyst dots 12 or may be distributed in a radon pattern.

In one embodiment and as shown in FIG. 1A, the catalyst dots 12 are uniformly distributed on the semiconductor substrate 10. The catalyst dots 12 may be formed by patterning a catalyst layer. The catalyst layer may be first deposited on the semiconductor substrate 10 by a conventional deposition technique including, but not limited to, a chemical vapor deposition (CVD), sputtering, and physical vapor deposition (PVD). The catalyst layer that is formed can have a thickness ranging from 10 nm to 50 nm, although lesser and greater thicknesses can also be employed.

The catalyst layer is subsequently patterned to form the catalyst dots 12 by lithography and etching processes. The lithographic step includes applying a photoresist (not shown) on the catalyst layer, exposing the photoresist to a desired pattern of radiation, and developing the exposed photoresist utilizing a conventional resist developer. The etching process comprises dry etch and/or wet chemical etch. Suitable dry etching processes that can be used in the present application include reactive ion etch (RIE), ion beam etching, plasma etching, or laser ablation. Typically, a RIE process is used. The etching process transfers the pattern from the patterned photoresist to the catalyst layer utilizing the semiconductor substrate 10 as an etch stop. After transferring the pattern into the catalyst layer, the residual photoresist can be removed utilizing a conventional resist stripping process such as, for example, ashing.

In another embodiment, the catalyst dots 12 may be formed utilizing a self-assembly process. The term "self-assembly" is used herein to denote the spontaneous organization of a material into a regular pattern. The self-assembly process utilizes block copolymers and techniques well known in the art. For example, a block copolymer layer (not shown) is first formed over the semiconductor substrate 10 by spin-coating. The block copolymer layer may include any block copolymer capable of self-assembling into larger order array structures. In one embodiment, the block copolymer is a PMMS-PS block copolymer. Upon annealing, the block copolymer undergoes a nanoscale phase separation and arranges into an array structure consisting of periodic spherical domains of a first polymer block surrounded by a matrix of a second polymer block. The first polymer block is then selectively removed to provide openings within the matrix of the second polymer block to expose portions of the semiconductor substrate 10. The openings are filled with a conductive material by plating to provide the catalyst dots 12. After forming the catalyst dots 12, the matrix of the second polymer block is removed.

Figure 2:
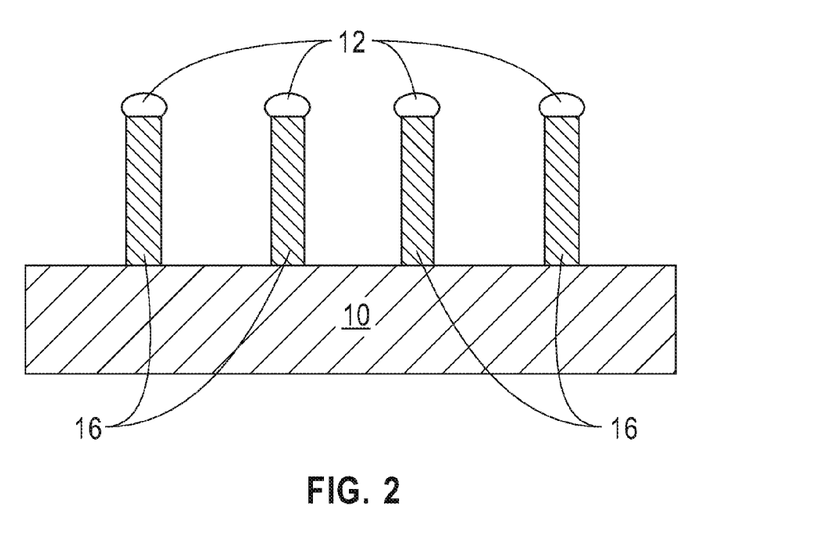
FIG. 2 is a cross-sectional view of the first exemplary semiconductor structure of FIG. 1B after growing semiconductor nanorods perpendicular to a top surface of the semiconductor substrate.

Referring to FIG. 2, semiconductor nanorods 16 are grown perpendicular to the top surface of the semiconductor substrate 10. The growth of the semiconductor nanorods 16 is assisted by the catalyst dots 12 and is typically carried out by CVD or plasma enhanced chemical vapor deposition (PECVD). In one embodiment, the semiconductor nanorods 16 are grown on the semiconductor substrate 10 by a vapor-liquid-solid (VLS) growth process with a semiconductor precursor gas (e.g., silane ($SiH_4$) for silicon nanorods; germane ($GeH_4$) for germanium nanorods). In one embodiment, the semiconductor nanorods 16 are silicon nanorods 16. When VLS growth is initiated, a metallic-semiconductor (typically a gold-silicon) liquid alloy is formed. With additional supply of semiconductor precursor from the gas phase (e.g., $SiH_4$), the metallic-semiconductor droplet becomes supersaturated with the semiconductor material and the excess semiconductor material is deposited at the solid-liquid interface. As a result, the liquid droplet rises from the original substrate surface to the tip of a growing semiconductor nanorod 16. After semiconductor nanorod growth, the metallic semiconductor liquid alloy will separate during cooling without forming a metal semiconductor solid alloy. As a result, the liquid alloy reverts back to a catalyst dot 12 after cooling.

The semiconductor nanorods 16 formed by a VLS growth are epitaxially aligned to the semiconductor substrate 10. By "epitaxially aligned" it is meant that the semiconductor nanorods have a same crystal orientation as that of the underlying semiconductor substrate. The semiconductor nanorods 16 may be grown to any suitable height. In one embodiment, the semiconductor nanorods 16 are grown to a height ranging from 10 μm to 100 μm. The diameter of the semiconductor nanorods 16 prepared by the VLS process is defined by the diameter of the catalyst dots 12 and may be from 1 nm to 100 nm, although lesser and greater lengths can also be employed.

The semiconductor nanorods 16 that are formed comprise a semiconductor material the same as that of the underlying semiconductor substrate 10. In one embodiment, the semiconductor nanorods 16 are comprised of silicon.

Figure 3:
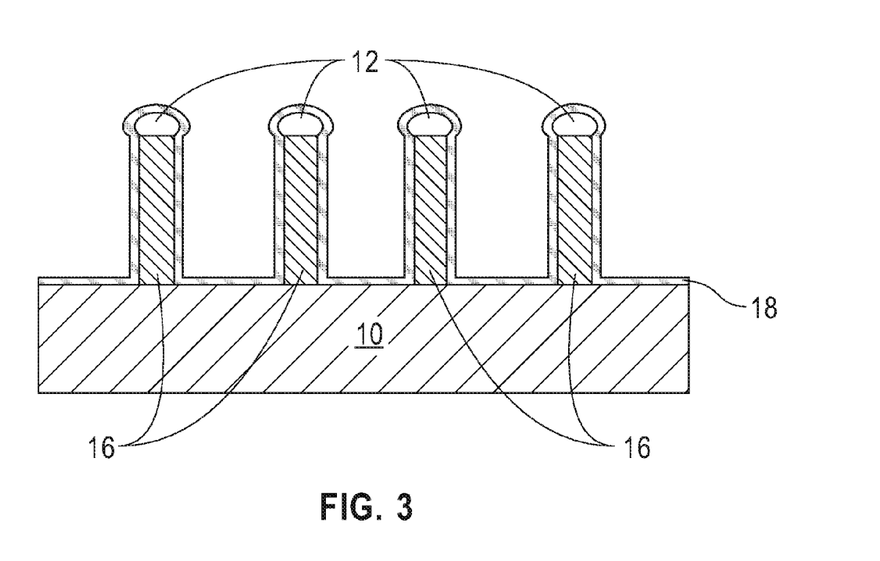
FIG. 3 is a cross-sectional view of the first exemplary semiconductor structure of FIG. 2 after conformally depositing a dielectric material layer on exposed surfaces of the semiconductor substrate, the semiconductor nanorods and the catalyst dots.

Referring to FIG. 3, a dielectric material layer 18 is conformally deposited on exposed surfaces of the semiconductor substrate 10, the semiconductor nanorods 16 and the catalyst dots 12. The dielectric material layer 18 may include a high dielectric constant (high-k) material having a dielectric constant greater than 8.0. Exemplary high-k materials include, but are not limited to silicon nitride, hafnium oxide, aluminum oxide, titanium oxide and tantalum oxide. The dielectric material layer 18 may be formed by a conventional deposition process such as, for example, CVD or PVD. The thickness of the dielectric material layer 18 can be from 1 nm to 10 nm, although lesser and greater thicknesses can be employed.

Figure 4:
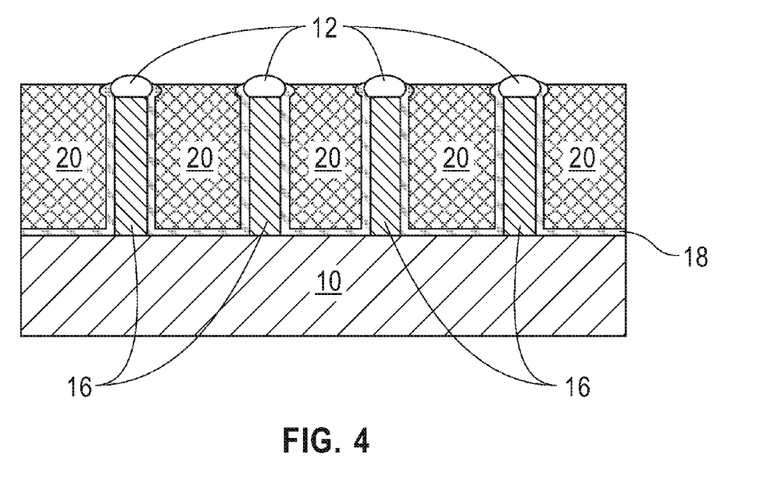
FIG. 4 is a cross-sectional view of the first exemplary semiconductor structure of FIG. 3 after forming a conductive material layer on the dielectric material layer to completely fill spaces between the semiconductor nanorods.

Referring to FIG. 4, a conductive material layer 20 is formed on the dielectric material layer 18 to completely fill spaces between the semiconductor nanorods 16. The conductive material layer 20 may include a metal or a doped semiconductor material. The metal can be an element metal such as tungsten, titanium, tantalum, aluminum, or copper, an alloy of at least two elemental metals, a conductive metal nitride, or a conductive metal oxide. The doped semiconductor material can be doped polysilicon. The conductive material layer 20 may be formed by a conventional deposition process such as, for example, CVD, PVD, ALD, or plating. The conductive material layer 20 is deposited to a thickness above the topmost surface of the dielectric material layer 18.

Portions of the conductive material layer 20 and the dielectric material layer 18 that are formed above the top surfaces of the catalyst dots 12 may be removed by a conventional planarization process such as, for example, chemical mechanical planarization (CMP). In one embodiment, the planarization process may also remove upper portions of the catalyst regions such that the catalyst dots 12 have planar top surfaces (not shown). In another embodiment, the planarization process may completely remove the catalyst dots 12 such that the conductive material layer 20 has a top surface coplanar with top surfaces of the semiconductor nanorods 16.

A plurality of discrete capacitors is thus formed. Each of the semiconductor nanorods 16 forms a bottom electrode, the dielectric material layer 18 forms a capacitor dielectric and the conductive material layer 20 forms a top electrode of one of the capacitors. The plurality of discrete capacitors shares a common capacitor dielectric (i.e., the dielectric material layer 18) and a common top electrode (i.e. the conductive material layer 20). In the first embodiment of the present application, each semiconductor nanorod 16 serves as an active component (i.e., bottom electrode) of the capacitor. The dense array of semiconductor nanorods 16 allows high integration densities of the capacitors to be reached, leading to a high capacitance per unit area.

Figure 5:
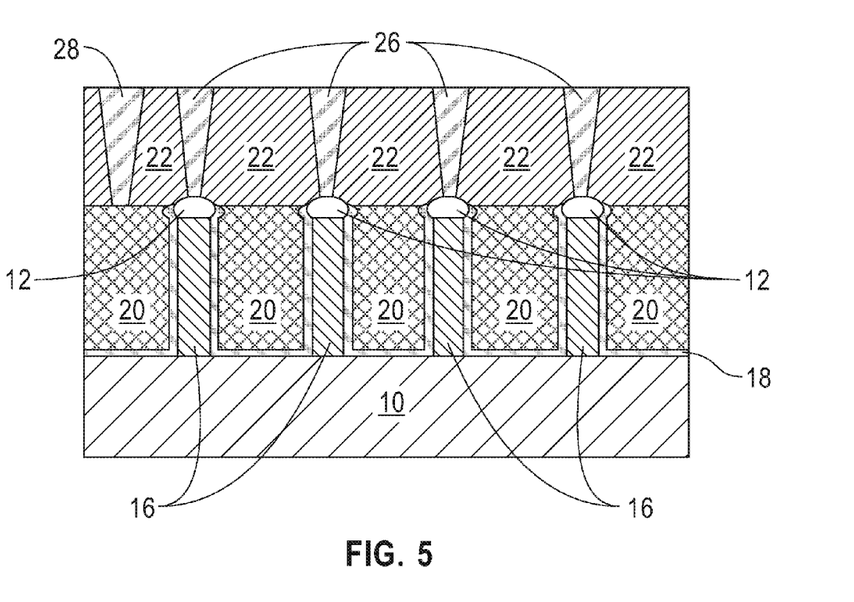
FIG. 5 is a cross-sectional view of the first exemplary semiconductor structure of FIG. 4 after forming a contact level dielectric layer and contact structures within the contact level dielectric layer.

Referring to FIG. 5, a contact level dielectric layer 22 is deposited over the conductive material layer 20, the dielectric material layer 18, and the catalyst dots 12 or the semiconductor nanorods 16 if the catalyst dots 12 have been removed. The contact level dielectric layer 22 may include a dielectric material such as undoped silicon oxide, doped silicon oxide, porous or non-porous organosilicate glass, porous or non-porous nitrogen-doped organosilicate glass, or a combination thereof. The contact level dielectric layer 22 may be formed by CVD, PVD, or spin coating. If the contact level dielectric layer 22 is not self-planarizing, the top surface of the contact level dielectric layer 22 can be planarized, for example, by CMP.

Various contact structures including first contact structures 26 in contact with the catalyst dots 12, and a second contact structure 28 in contact with the conductive material layer 20 are formed within the contact level dielectric layer 22. In some embodiments of the present application, the first contact structures 26 may directly contact top surfaces of the semiconductor rods 16 if the catalyst dots 12 have been removed. Various contact structures (26, 28) may be formed, for example, by forming first contact openings (not shown) and a second contact opening (not shown) through the contact level dielectric layer 22 using a combination of lithographic patterning and an anisotropic etch. The first contact openings expose top surfaces of the catalyst dots 12 or top surfaces of the semiconductor nanorods 16 if the catalyst dots 12 have been removed. The second contact opening exposes a portion of the top surface of the conductive material layer 20. The first and the second contact openings are then filled with a conductive material using a conventional deposition process, such as, for example, CVD, PVD, ALD, or plating. Exemplary conductive materials include, but are not limited to, copper, tungsten, aluminum tantalum, titanium nitride, or tantalum nitride. Excess portions of the conductive material above the contact level dielectric layer 22 can be subsequently removed, for example, by a recess etch or CMP.

Figure 6:
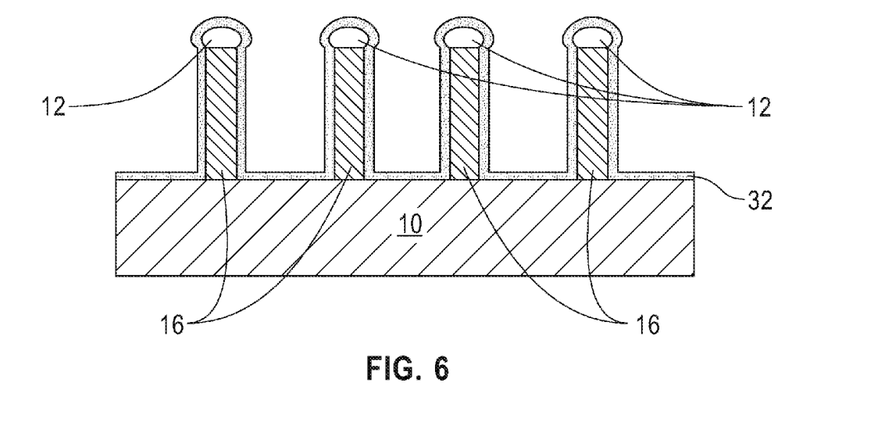
FIG. 6 is a cross-sectional view of a second exemplary semiconductor structure that can be derived from the first exemplary semiconductor structure of FIG. 2 after conformally depositing a first conductive material layer over exposed surfaces of the semiconductor substrate, the semiconductor nanorods and the catalyst dots according to a second embodiment of the present application.

Referring to FIG. 6, a second exemplary semiconductor structure of the present application according to a second embodiment of the present application is derived from the first exemplary semiconductor structure of FIG. 2 by conformally depositing a first conductive material layer 32 over exposed surfaces of the semiconductor substrate 10, the semiconductor nanorods 16, and the catalyst dots 12. The first conductive material layer 32 functions as a bottom electrode for a metal/insulator/metal (MIM) capacitor. The first conductive material layer 32 may include a metal or a doped semiconductor material. The metal can be an element metal such as tungsten, titanium, tantalum, aluminum, or copper, an alloy of at least two elemental metals, a conductive metal nitride, or a conductive metal oxide. The doped semiconductor material can be doped polysilicon. The first conductive material layer 32 may be formed by a conventional deposition process such as, for example, CVD or ALD. The thickness of the first conductive material layer 32 may be from 20 nm to 200 nm, although lesser and greater thicknesses can also be employed.

Figure 7:
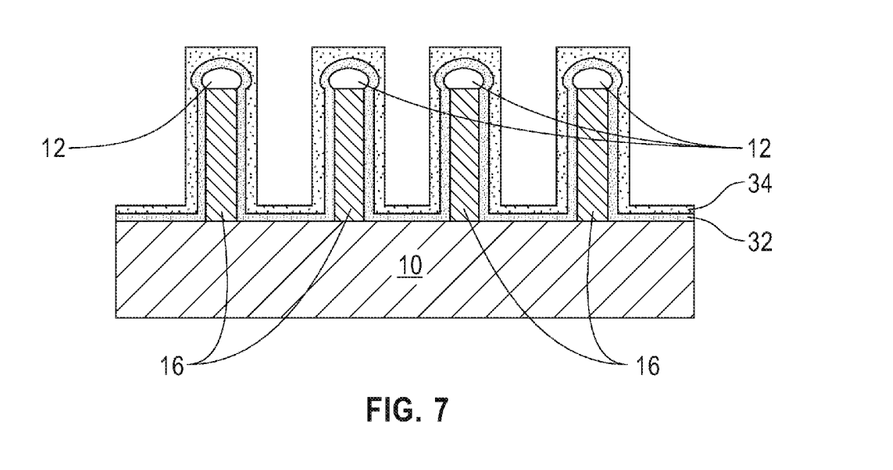
FIG. 7 is a cross-sectional view of the second exemplary semiconductor structure of FIG. 6 after conformally depositing a dielectric material layer over the first conductive material layer.

Referring to FIG. 7, a dielectric material layer 34 is deposited conformally over the first conductive material layer 32. The dielectric material layer 34 functions as a capacitor insulator for the MIM capacitor and may include a high-k material such as silicon nitride, hafnium oxide, tantalum pentoxide, silicon dioxide, or aluminum oxide. The dielectric material layer 34 may be deposited, for example, by CVD, ALD, or a combination thereof. The thickness of the dielectric material layer 34 that is formed may be from about 1 nm to about 10 nm, although lesser and greater thicknesses can also be employed.

Figure 8:
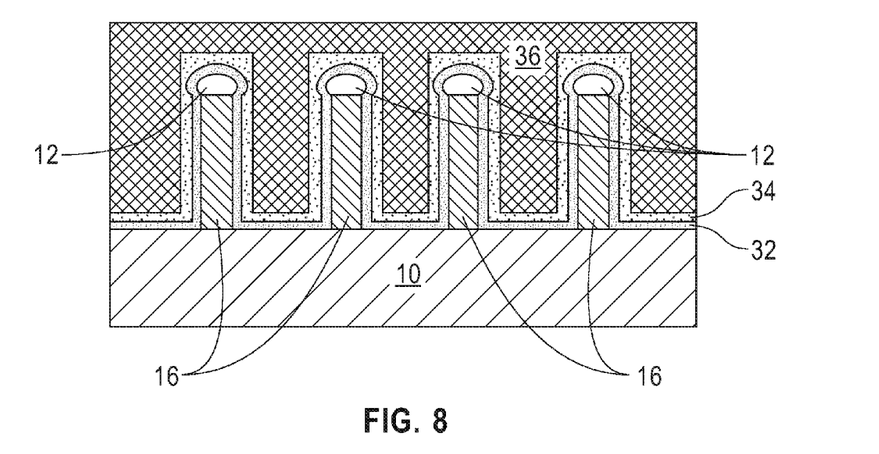
FIG. 8 is a cross-sectional view of the second exemplary semiconductor structure of FIG. 7 after forming a second conductive material layer over the dielectric material layer to fill the spaces between the semiconductor nanorods.

Referring to FIG. 8, a second conductive material layer 36 is formed over the dielectric material layer 34 to fill the spaces between the semiconductor nanorods 16. The second conductive material layer 36 functions as a top electrode for the MIM capacitor. The second conductive material layer 36 may include a metal the same as, or different from, the first conductive material layer 32. The second conductive material layer 36 may include a metal or a doped semiconductor material. The metal can be an element metal such as tungsten, titanium, tantalum, aluminum, or copper, an alloy of at least two elemental metals, a conductive metal nitride, or a conductive metal oxide. The doped semiconductor material can be doped polysilicon. The second conductive material layer 36 may be formed by CVD or PEVD.

An MIM capacitor is thus formed. The first conductive material layer 32 forms a bottom electrode, the dielectric material layer 34 forms a capacitor dielectric and the second conductive material layer 36 forms a top electrode of the MIM capacitor. The first conductive material layer 32 wraps around the semiconductor rods 16 so that the bottom electrode has an increased surface area, thereby increasing the capacitance of the MIM capacitor.

Figure 9:
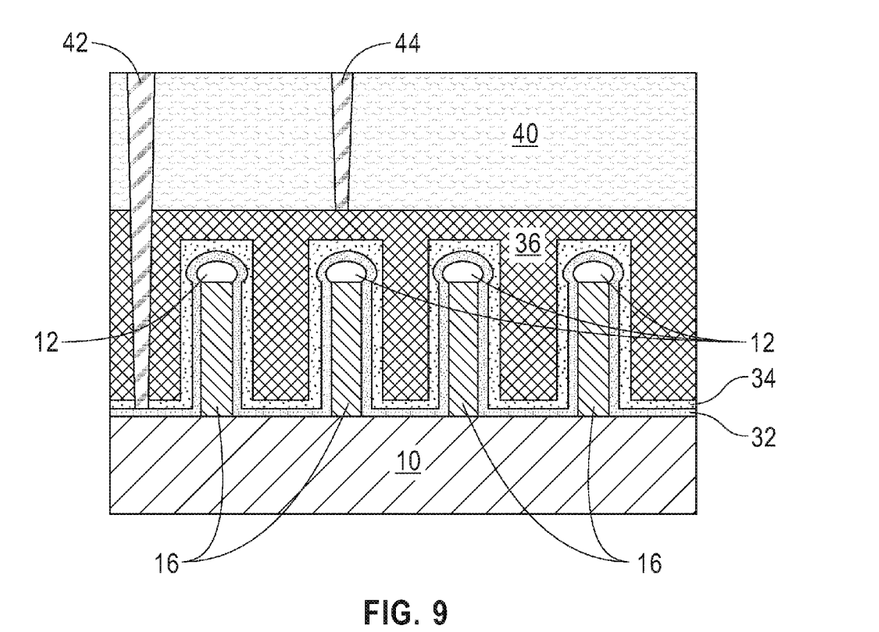
FIG. 9 is a cross-sectional view of the second exemplary semiconductor structure of FIG. 8 after forming a contact level dielectric layer on the second conductive material layer and contact structures within the contact level dielectric layer.

Referring to FIG. 9, a contact level dielectric layer 40 is formed on the second conductive material layer 36 by performing the processing steps of FIG. 5. Subsequently, various contact structures 42, 44 are formed by performing the processing steps of FIG. 5. The contact structures includes a first contact structure 42 extending through the contact level dielectric layer 40, the second conductive material layer 36 and the dielectric material layer 34 and contacting the first conductive material layer 32, and a second contact structure 44 extending through the contact level dielectric 40 and contacting the second conductive material layer 36. In some embodiments of the present application, the first contact structure may be a back contact structure contacting the semiconductor substrate 10 (not shown) to enable vertical stacking of a plurality of chips.

The capacitor(s) of the present application can be integrated with other circuits by stacking the semiconductor substrate having the capacitor(s) formed thereon on another substrate having a plurality of active circuit devices such as field effect transistors to form a three-dimension semiconductor device architecture. Interconnects are subsequently formed to connect the capacitors and the active circuit devices. Structures and processes for forming the active circuit devices and interconnects are well known in the art, and thus are not described further herein.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising a capacitor, the capacitor comprising:
a plurality of semiconductor nanorods present on and oriented perpendicular to a top surface of a semiconductor substrate, wherein a top surface of each of the plurality of semiconductor nanorods has a catalyst dot present thereon;
a conformal first conductive material layer present on exposed surfaces of the semiconductor substrate, the plurality of semiconductor nanorods, and each catalyst dot;
a conformal dielectric material layer present on the conformal first conductive material layer; and
a second conductive material layer present on the dielectric material layer, the second conductive material layer filling the spaces between the plurality of semiconductor nanorods.

2. The semiconductor structure of claim 1, wherein each of the plurality of semiconductor nanorods comprises a semiconductor material the same as a semiconductor material of the semiconductor substrate.

3. The semiconductor structure of claim 1, wherein each of the plurality of semiconductor nanorods has a same crystal orientation as that of the semiconductor substrate.

4. The semiconductor structure of claim 1, wherein each of the plurality of the semiconductor nanorods has a diameter the same as the diameter of each catalyst dot.

5. The semiconductor structure of claim 1, wherein each of the plurality of the semiconductor nanorods has a height ranging from 10 µm to 100 µm.

6. The semiconductor structure of claim 1, wherein each of the plurality of semiconductor nanorods comprises an intrinsic semiconductor material.

7. The semiconductor structure of claim 1, wherein each of the conformal first conductive material layer and the second conductive material layer is entirely composed of an electrically conductive material.

8. The semiconductor structure of claim 4, wherein each of the conformal first conductive material layer and the second conductive material layer comprises tungsten, titanium, tantalum, aluminum, copper, an alloy thereof, a conductive metal nitride, a conductive metal oxide, or doped polysilicon.

9. The semiconductor structure of claim 1, wherein the conformal first conductive material layer has a thickness ranging from 20 nm to 200 nm.

10. The semiconductor structure of claim 1, wherein the conformal dielectric material layer comprises silicon nitride, hafnium oxide, aluminum oxide, titanium oxide, or tantalum oxide.

11. The semiconductor structure of claim 1, wherein the conformal dielectric material layer has a thickness ranging from 1 nm to 10 nm.

12. The semiconductor structure of claim 1, wherein each catalyst dot comprises gold, aluminum, titanium, indium, iron, or nickel.

13. The semiconductor structure of claim 1, wherein each catalyst dot has a diameter ranging from 1 nm to 100 nm.

14. The semiconductor structure of claim 1, wherein the second conductive material layer has a top surface located above topmost surfaces of the conformal dielectric material layer.

15. The semiconductor structure of claim 1, wherein the semiconductor substrate comprises Si, Ge, SiGe, SiC, SiGeC, InAs, GaAs, or InP.

16. The semiconductor structure of claim 1, further comprising a contact level dielectric layer present on a top surface of the second conductive material layer.

17. The semiconductor of claim 16, further comprising a first contact structure extending through the contact level dielectric layer, the second conductive material layer and the conformal dielectric material to form contact with the conformal first conductive material layer and a second contact structure extending through the contact level dielectric layer to form contact with the second conductive material layer.

18. The semiconductor structure of claim 1, wherein the plurality of semiconductor nanorods are uniformally distributed on the semiconductor substrate.

19. The semiconductor structure of claim 1, wherein the plurality of semiconductor nanorods are randomly distributed on the semiconductor substrate.

* * * * *